United States Patent [19]

Baghdadi et al.

[11] 4,120,743

[45] Oct. 17, 1978

[54] CROSSED GRAIN GROWTH

[75] Inventors: Aslan Baghdadi; Ralph J. Ellis, both of Mesa, Ariz.

[73] Assignee: Motorola, Inc., Schaumburg, Ill.

[21] Appl. No.: 645,574

[22] Filed: Dec. 31, 1975

[51] Int. Cl.² .............................................. B01J 17/12
[52] U.S. Cl. ............................. 156/620; 156/DIG. 88
[58] Field of Search ....... 156/617, 620, 624, DIG. 80, 156/DIG. 88; 423/348; 29/576 T, 576 R, 592, 585; 427/255; 148/11.5 F, 11.5 B, 133

[56] References Cited

U.S. PATENT DOCUMENTS

| | | | |
|---|---|---|---|
| 2,897,329 | 7/1959 | Matare | 156/620 |
| 3,092,462 | 6/1963 | Goorissen | 156/620 |
| 3,096,158 | 7/1963 | Gaule | 23/273 |
| 3,287,107 | 11/1966 | Eaton | 156/DIG. 88 |
| 3,591,423 | 7/1971 | Kawamura | 148/13 |
| 3,900,943 | 8/1975 | Sirtle | 29/576 |
| 3,903,325 | 9/1975 | Horiuchi | 427/255 |

FOREIGN PATENT DOCUMENTS 1,226,473  3/1971  United Kingdom ............ 156/DIG. 80

Primary Examiner—Hiram H. Bernstein
Attorney, Agent, or Firm—John A. Fisher

[57] ABSTRACT

A method of producing a sheet of semiconductor material directly usable for the production of solar cells is disclosed. The method comprises establishing a molten region at an edge of a sheet of semiconductor material, moving the molten region across the sheet to create a path of elongated crystal grains, establishing a molten zone along a portion of the path of the elongated crystal grains and parallel thereto, and causing the molten zone to travel in a direction transverse to the path of elongated crystal grains.

12 Claims, 7 Drawing Figures

CROSSED GRAIN GROWTH

RELATED APPLICATION

The application is related to copending application, commonly assigned application Ser. No. 645,857, filed in the name J. Ellis, et al. on Dec. 31, 1975, and entitled "Semiconductor Sheet Crystal Structure Modification".

BACKGROUND OF THE INVENTION

This invention relates to a method of modifying the crystalline structure of a sheet of semiconductor material. More particularly, this invention relates to a method for producing silicon sheets useful for the production of solar cells.

Semiconductor devices are generally fabricated from wafers of monocrystalline silicon. Various procedures for preparing monocrystalline silicon wafers have been described in the prior art. Thus, the Czochralski method comprises pulling a monocrystalline rod from a pool of liquid produced by melting polycrystalline silicon. Another method, known as the float zone technique, comprises pulling a monocrystalline rod from a liquid region, formed by localized heating, within or on top of an ingot of polycrystalline material. Both techniques produce a monocrystalline rod which must be sawed into slices and further processed by lapping, polishing, and/or etching to produce wafers suitable for the production of semiconductor devices. Another prior art method, directed to pulling single crystals in the form of long flat strips from a melt, is disclosed in U.S. Pat. No. 3,096,158. However, this method requires the use of a seed crystal, a melt, a concentrator element, a multiple-turn coil and a shield.

With the present need for new energy sources, many suggestions have revolved around the use of solar energy. One way of utilizing this type of energy is with solar cells, whereby radiant solar energy is converted directly to electrical energy. However, systems using solar cells will require large amounts of semiconductor material, that is, generally monocrystalline silicon. If such systems are to become commercially acceptable, such silicon must be obtainable at a cost far less than present costs for monocrystalline silicone wafers.

SUMMARY OF THE INVENTION

It is an object of this invention to provide an improved method for the manufacture of sheets of semiconductor material.

It is a further object of the present invention to provide a sheet of semiconductor material directly from a sheet of polycrystalline material.

It is another object of this invention to provide a "self-seeding" method for the conversion of polycrystalline sheets to useable sheets of semiconductor material.

It is still another object of this invention to provide a sheet of semiconductor material by a method which avoids the use of reservoirs of liquid silicon and shaping elements.

In accordance with this invention there is provided a method for modifying the crystalline structure of a sheet of semiconductor material which comprises the steps of establishing a molten region at an edge of the sheet, moving the molten region across the sheet to an opposing edge thereby creating a path of elongated crystal grains, establishing a molten zone parallel to said path along a portion thereof, and causing the molten zone to travel in a direction transverse to said path.

The method of this invention will be better understood by reference to the following description of the invention and the accompanying drawings.

DETAILED DESCRIPTION OF THE INVENTION

Figure 1A:
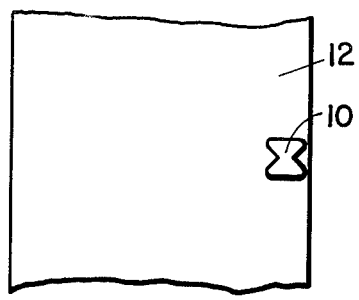
FIG. 1 illustrates perspective views of steps of making a sheet in accordance with the method of this invention.
Figure 1B:
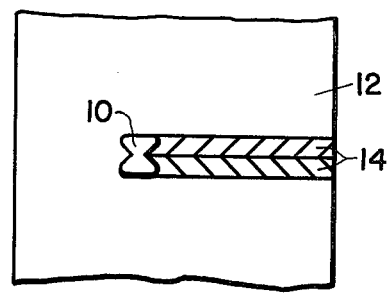
Figure 1C:
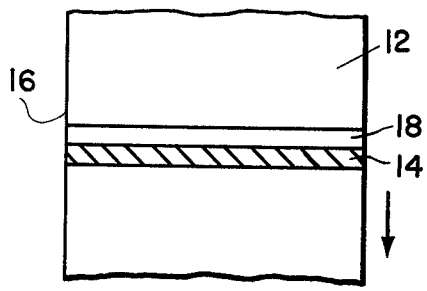
Figure 1D:
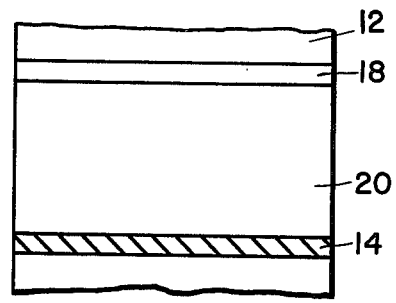

Referring to FIG. 1a, a molten region 10 is established in polycrystalline sheet 12. As will be apparent hereinafter, the molten region 10 must be contiguous with one edge of the polycrystalline sheet. Molten region 10 is obtained by applying any convenient source of heat, for example, a laser beam, an e beam or RF heating. The molten region 10 must extend through the thickness of the polycrystalline sheet 12, and may have any desired configuration. Thus whereas it is shown as having an elongated shape with a narrowed center portion, it can be circular, square, diamond-shaped, etc. Then the molten region is moved across the width of the polycrystalline sheet as illustrated in FIG. 1b. While the molten region 10 can be moved by moving the sheet across the heat source, it is more convenient to move the heat source across the width of the sheet. The effect of moving the molten region 10 is to create a path of elongated crystal grains 14. The creation of this path is critical to obtaining an end product having the desired characteristics. Molten region 10 is moved to a position at least contiguous with an opposing edge 16 of the polycrystalline sheet 10 as shown in FIG. 1c. This can be achieved by stopping the source of heat when it reaches the opposing edge, or it can be moved over the edge. Subsequent to establishing a path of elongated crystal grains 14 transverse to the edge of polycrystalline sheet 12, a molten zone 18, abutting the path of elongated crystal grains 14 is established as shown in FIG. 1c. In the broadest embodiment of the invention, this is established by moving the radiant energy source or the polycrystalline sheet in a single path to establish the zone. As will be apparent hereinafter, it is critical that molten zone 18 at least abut the path of elongated crystal grains 14. Furthermore, molten zone 18 must permeate the thickness of polycrystalline sheet 12. Subsequent to the establishment of molten zone 18, the sheet is moved in a direction transverse to the molten zone 18 as represented by the arrow in FIG. 1c, while maintaining the molten zone by the continued application of heat. This results in the creation of a zone of monocrystalline semiconductor material 20 between molten zone 18 and the path of elongated crystal grains 14 as represented in FIG. 1d. The molten zone 18 is maintained, preferably by moving the heat source back and forth across the width of polycrystalline sheet 10 fast enough to keep a constant heat therein, and the movement in a direction transverse to the molten zone is continued until a web of monocrystalline semiconductor material of the desired length is obtained.

Figure 2A:
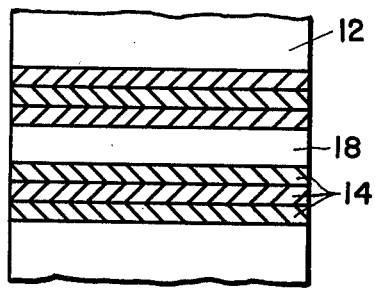
FIG. 2 shows perspective views of steps of making a sheet according to another embodiment of the method of this invention.
Figure 2B:
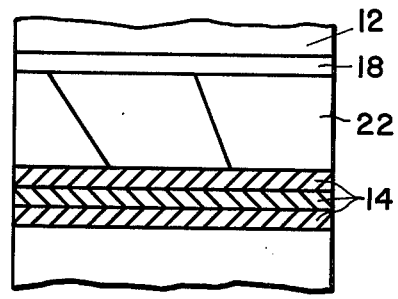

Turning to FIG. 2, another embodiment of the method is illustrated wherein several abutting paths of elongated crystal grains 14 are established by moving molten region 10 back and forth across the width of polycrystalline sheet 12. Molten zone 18 is then established somewhere within this area of elongated crystal grains 14 as shown in FIG. 2a. The creation of multiple paths of elongated grains 14 serves to minimize any potential defects that might occur if molten zone 18 does not abut a single path of elongated crystal grains 14. While FIG. 1d indicates that a sheet of monocrystalline silicon semiconductor material is obtained, it is not necessary to achieve such a structure. Instead, as shown in FIG. 2b, the sheet can comprise crystalline grains 22 which comprise a substantial fraction of the width of the ribbon. Thus, it has been found that good solar devices can be made from sheets of material comprising crystalline grains of a width of at least 20 percent of the width of the sheet. Utilization of such sheets eliminates waste and reduces the cost of the resultant devices.

Figure 3:
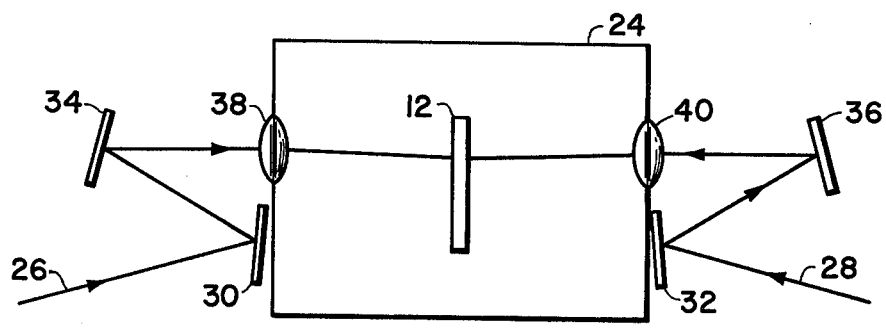
FIG. 3 is a top schematic view of a simplified apparatus for carrying out the method of this invention.

In FIG. 3, the schematic of one apparatus for carrying out the method of this invention is depicted. The polycrystalline sheet 12 is positioned in housing 24. It will be apparent that the sheet 12 is held by rollers at either end to permit moving and winding up of the final material. Laser beams 26, 28 are emitted from a source (not shown) and directed at back mirrors 30, 32, deflected to scanning mirrors 34, 36 and focused through lenses 38, 40. The laser beams then contact opposing sides, that is front and the back of the polycrystalline sheet 12 in order to produce the molten region 10. The laser beam is moved as described previously and the polycrystalline sheet is moved in accordance with the method of this invention.

While the particular type of heat source employed is not critical to the method of this invention, carbon dioxide laser beams having a wavelength of 10.6 microns which produce up to 400 watts of power have been found to be particularly suitable. It will be apparent that the total amount of energy required is dependent upon the thickness and width of the polycrystalline sheet 12, for example, about 200 watts are optimum where a sheet about ½ inch wide and 10 mils thick is employed. Furthermore, although FIG. 3 indicates that heat is applied to both the front and back of the polycrystalline sheet 12, this is not an essential feature of the invention. Thus, the heat can be applied to only one side of the sheet, with the proviso that the molten zones and regions must extend through the thickness of the ribbon.

Preferably the method of the invention is carried out in an oxygen containing atmosphere as described in the application of J. Ellis et al. Ser. No. 645,857, referenced above, titled "Semiconductor Sheet Crystal Structure Modification", and filed concurrently herewith.

With respect to the relative dimensions of the various elements of this invention, it should be noted that the widths of the molten region and molten zone are generally three to 10 times the thickness of the sheet. As representative dimensions the width of the sheet treated in accordance with the method of this invention can range from a fraction of an inch, to several inches, and preferably ranges from 0.5 inch up to 6 inches. The thickness of the sheet ranges from 4 mils to 20 mils with a preferred thickness of 3–6 mils, while the molten region has a width (the dimension transverse to the width of the sheet) of 25 to 100 mils.

The molten zone 18 has a width of about 25–75 mils, the width of this zone being the direction transverse to the width of the sheet. It should be noted that both the selected width of the molten region and the selected width of the molten zone are dependent on the thickness of the ribbon, the wider regions and zones being created in the thicker ribbons within the aforementioned ranges. Furthermoe, it is preferred to treat ribbons of semiconductor material, that is, sheets of material which are long with respect to their width.

While the source sheet has been referred to herein as polycrystalline material, it should be understood that the source material could be partially aligned polycrystalline material or a monocrystalline material having a sufficient number of defects to render it unusable in the production of solar devices. Preferably the material is silicon.

Other embodiments of the method of this inventin are contemplated. For example, while the figures depict moving the molten zone by moving the polycrystalline sheet, the zone can be moved by moving the heat source.

It will be apparent from the description herein that the method of this invention presents numerous advantages over prior art methods. Thus, a usable sheet of semiconductor material can be directly produced from a sheet of polycrystalline material by a "self-seeding" method, without the technique needed for molen source material, feeding devices, shaping equipment and the like.

Furthermore, excellent control with respect to sheet width and thickness is achieved by eliminating complex conversion apparatus and methods.

Although the invention has been described in connection with certain preferred embodiments, it is not intended that the invention be limited thereto. Thus it is intended that the invention cover all alternatives, arrangements, equivalents and embodiments which may be included in the scope of the following claims.

What is claimed is:

1. A method for modifying the crystalline structure of a sheet of semiconductor material which comprises:
    establishing a molten region at the edge of and extending through the thickness of said sheet;
    moving said molten region across said sheet to an opposing edge of said sheet thereby creating a path of elongated crystal grains;
    establishing a molten zone parallel to and abutting said path along a portion thereof and extending through the thickness of said sheet; and
    causing said molten zone to travel in a direction transverse to said path.

2. The method of claim 1 further including the step of moving said molten region back and forth across said sheet to create a plurality of paths of elongated crystal grains prior to establishing said molten zone.

3. The method of claim 2 wherein said molten zone is established within the plurality of paths of elongated crystal grains.

4. A method for producing a ribbon of semiconductor material having crystalline grains which comprise a substantial fraction of the width of said ribbon which comprises:
    providing a ribbon of semiconductor material;
    establishing a molten region contiguous with a longitudinal edge of said ribbon of semiconductor material and extending through the thickness of said ribbon;
    moving said molten region across said ribbon to a position at least contiguous with an opposing longitudinal edge of said ribbon of semiconductor material thereby creating a path of elongated crystal grains;

heating in a direction transverse to the longitudinal edges of said ribbon along a portion of the path of elongated crystal grains to provide a molten zone abutting said path of elongated crystal grains and extending through the thickness of said ribbon; and causing the molten zone to travel in a direction parallel to the longitudinal edges of said ribbon.

5. The method of claim 4 wherein said molten zone is caused to travel by applying heat from a source while moving said ribbon in a direction transverse to the direction of said molten zone and away from said source.

6. The method of claim 5 wherein the width of said molten region is three to 10 times the thickness of the ribbon.

7. The method of claim 5 wherein the width of said molten zone is three to 10 times the thickness of the ribbon.

8. The method of claim 5 wherein said semiconductor material is silicon.

9. The method of claim 4 further including the step of moving said molten region back and forth across said ribbon to create a plurality of paths of elongated crystal grains prior to establishing said molten zone.

10. The method according to claim 9 wherein said molten zone is established within the plurality of paths of elongated crystal grains.

11. The method according to claim 9 wherein said molten zone is caused to travel by applying heat from a source while moving said ribbon in a direction transverse to the direction of said molten zone and away from said source.

12. The method of claim 11 wherein said semiconductor material is silicon.

* * * * *